(12) United States Patent
Stockman

(10) Patent No.: US 6,537,838 B2
(45) Date of Patent: Mar. 25, 2003

(54) FORMING SEMICONDUCTOR STRUCTURES INCLUDING ACTIVATED ACCEPTORS IN BURIED P-TYPE III-V LAYERS

(75) Inventor: Stephen A. Stockman, Morgan Hill, CA (US)

(73) Assignee: Limileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/879,549

(22) Filed: Jun. 11, 2001

(65) Prior Publication Data

US 2002/0187568 A1 Dec. 12, 2002

(51) Int. Cl.$^7$ .............................................. H01L 21/00
(52) U.S. Cl. .............................. 438/22; 438/46; 257/96
(58) Field of Search ..................... 438/45–47, 507–509; 257/96, 101–103, 201, 613, 615, 609

(56) References Cited

U.S. PATENT DOCUMENTS

| | | | |
|---|---|---|---|
| 5,252,499 A | 10/1993 | Rothschild | |
| 5,306,662 A | 4/1994 | Nakamura et al. | |
| 5,578,839 A | * 11/1996 | Nakamura et al. | 257/96 |
| 5,729,029 A | 3/1998 | Rudaz | 257/13 |
| 6,133,589 A | 10/2000 | Krames et al. | 257/103 |
| 6,235,548 B1 | * 5/2001 | Ota et al. | 438/45 |
| 6,335,218 B1 | * 1/2002 | Ota et al. | 438/46 |

FOREIGN PATENT DOCUMENTS

| | | |
|---|---|---|
| EP | 0 731 512 A2 | 9/1996 |
| EP | 0 845 818 A2 | 6/1998 |
| EP | 0 541 373 B1 | 9/1998 |

OTHER PUBLICATIONS

Translation from Japanese, Japanese Patent No. 2540791, Pub. Date Oct. 9, 1996, pp. 1–13.
Translation from Japanese, Unexamined Japanese Patent Application No. 5–198841, Disclosure Date Aug. 6, 1993, pp. 1–11.
Translation from Japanese, Unexamined Japanese Patent Application No. 5–206520, Disclosure Date Aug. 13, 1993, pp. 1–9.
S. A. Stockman and G. E. Stillman, "Hydrogen in III–V Device Structures", Materials Science Forum vols. 148–149 (1994), pp. 501–536.

* cited by examiner

*Primary Examiner*—David Nelms
*Assistant Examiner*—Dung Anh Le
(74) *Attorney, Agent, or Firm*—Patent Law Group LLP; Brian D. Ogonowsky

(57) ABSTRACT

To allow hydrogen to out-diffuse from a buried Group III-nitride compound semiconductor p-type layer, the wafer is etched to form trenches in the p-type layer to expose sides of the p-type layer. After the etch, the wafer is then annealed. The duration and temperature of the anneal depend upon the spacing of the exposed sides of the p-type layer and the thickness of the p-type layer. The hydrogen diffuses easily through the p-type layer and out the sides exposed by the trenches. The result is a buried p-type layer that is more highly conductive than had the trenches not been formed prior to the anneal. In another embodiment, a surface of an acceptor-doped Group III-V p-type layer is covered with an overlying n-type layer. A portion of the n-type layer is etched to expose the surface of the p-type layer. An anneal is then carried out to out-diffuse hydrogen from the exposed surface of the p-type layer to increase the conductivity of the p-type layer.

15 Claims, 2 Drawing Sheets

FORMING SEMICONDUCTOR STRUCTURES INCLUDING ACTIVATED ACCEPTORS IN BURIED P-TYPE III-V LAYERS

FIELD OF THE INVENTION

The present invention relates to GaN-based III–V semiconductor devices and, in particular, to lowering the resistivity of buried p-type gallium nitride layers in devices such as light-emitting diodes, laser diodes, or heterojunction bipolar transistors.

BACKGROUND

Light-emitting diodes (LEDs) are a highly durable solid-state source of light capable of achieving high luminous efficiency. One important class of III–V light-emitting diodes is based upon compounds of Group III atoms (particularly, In, Ga, and Al) with Group V nitrogen (N), typically abbreviated as "III-nitride." One family of III-nitride compounds has the general composition $In_xAl_yGa_{1-x-y}N$, where $0 \leq (x,y) \leq 1$ and $x+y \leq 1$. This general composition will be simply referred to as GaN. III-nitrides are capable of emitting light that spans a large portion of the ultraviolet and visible electromagnetic spectrum including blue, green, and yellow wavelengths. Improving the brightness and other optical properties of LEDs is an important technical goal.

FIG. 1 is an example of a particular type of LED 10 developed by the present assignee, called an n-p-n tunnel junction LED, having a p-type GaN layer 12 sandwiched between two n-type GaN layers 14 and 15. Each of these layers 12, 14, and 15 may actually consist of many individual epitaxial layers with varying composition or doping level.

The sandwiched p-type layer 12 is referred to as a buried p-type layer. The various layers are epitaxially grown over a sapphire, SiC, or other type of substrate 16. N-type layer 15 and p-type layer 12 are highly doped. The p-n junction formed by these two layers is reverse-biased by application of a voltage between metal contacts 20 and 21. Since the doping levels of these two layers is very high ($>10^{19}cm^{-3}$), tunneling across the space-charge region can occur at a low reverse bias voltage (<1V), allowing current to flow across the junction. The layers 12 and 14 form a forward-biased p-n junction. When the electrons from n-type layer 14 recombine with the holes from p-type layer 12, photons of a desired wavelength are emitted from an active region located at the p-n junction between layers 12 and 14. Since the various layers, including the substrate 16, are substantially transparent, light is emitted by LED 10.

Alternatively, the tunnel junction may be formed by layers 12 and 14, with the active region placed at the junction of layers 12 and 15. In either case, this structure has the advantage over conventional p-n junction LEDs of using thick n-type layers, with low resistivity, on both sides of the active region. This basic structure can also improve the performance of GaN-based laser diodes.

Heterojunction bipolar transistors (HBTs) also use an n-p-n structure, and the problem discussed below is equally applicable to LED, laser, and bipolar transistor structures. FIG. 2 illustrates one type of HBT 22 having a substrate 23, an n-type GaN collector 24, a p-type GaN base 25, an n-type GaN emitter 26, and metal contacts 27, 28, and 29. During the epitaxial growth process, prior to etching the emitter 26 layer to expose the surface of the base 25 layer for the base contact 28 area, the Mg-doped base 25 is "buried" under the n-type emitter 26.

It is important in the above structures that the conductivity of the n-type and p-type layers be high so that the layers conduct current with a small forward voltage (e.g., <5V for the LED of FIG. 1) applied to the contacts.

Although forming low resistivity n-type GaN layers is relatively easy, forming a p-type GaN layer with low resistivity has proven difficult. In a typical process for forming the various GaN epitaxial layers, $NH_3$ (ammonia) gas is introduced into a chamber during a metal organic chemical vapor deposition (MOCVD) process to contribute the N component, while other gases are introduced to contribute the Group III components and the dopants. To form p-type material, the dopant is typically magnesium (Mg). The Mg atoms are also referred to as acceptors.

During growth of the GaN material incorporating the Mg acceptors, some of the hydrogen atoms from the reaction gases are incorporated in the acceptor-doped epitaxial layers and form a complex with the Mg acceptors, where H is bonded to a nearest-neighbor N atom. This passivates most of the Mg acceptors, effectively neutralizing the effect of these Mg acceptors and leaving a layer which is p-type, but fairly resistive with a hole concentration less than $5 \times 10^{15} cm^{-3}$.

Unintentional H passivation in p-type III–V semiconductors grown by MOCVD is a well-known phenomena. H passivation has been observed in InP, GaAs, InAlGaP, and other materials. See the article "Hydrogen in III–V Device Structures," by Stephen Stockman and Gregory Stillman, Materials Science Forum, volumes 148–149 (1994), pp. 501–536, and the articles referenced therein.

In a conventional LED structure, the Mg-doped layer is at the surface (i.e., it is not buried beneath an n-type layer). In this case, low-resistivity may be achieved following epitaxial growth by simple annealing in a hydrogen-free ambient to activate acceptors in the acceptor-doped material. This is commonly used as part of the fabrication process in the compound semiconductor industry. See U.S. Pat. No. 5,252,499 to Neumark Rothschild and U.S. Pat. No. 5,306,662 to Nichia Chemical Industries, Ltd. For GaN materials, this thermal annealing process is used to convert highly resistive insulating material to p-type conductivity.

In the prior art, after the anneal, the wafer containing the layers is patterned and etched, followed by a metalization to provide the various contacts. The individual LEDs are then separated out, and the various devices are packaged.

We have found, however, that in devices, such as tunnel-junction LEDs, which incorporate a buried Mg-doped layer, annealing the epitaxial structure, even at temperatures exceeding 800° C., does not result in adequate activation of Mg acceptors. In other words, the annealed p-type buried layer is far from having low resistivity.

Additionally, at such high anneal temperatures, the material quality may be degraded. In one actual device subjected to the high temperature anneal, an initial forward voltage of 15–20 volts (to forward bias the p-n junction) was only reduced by a few volts after the anneal. A high current "soak" for several hours reduced the forward voltage to about 5 volts due to Mg activation via electron-hole recombination in the resistive p-type layer. However, this "soak" is undesirable for a number of reasons: a burn-in is required, complete activation is not achieved, the forward voltage is still too high, the remaining hydrogen may have adverse effects, and there are potential reliability problems.

One reason that a lengthy, high temperature anneal is inadequate to out-diffuse the hydrogen from the p-type layer is that the overlying n-type layer acts as a barrier to hydrogen escape from the surface. One reason for this is that there is a depletion region formed at the p-n interface creating positively charged ions on the n-side of the depletion region and negatively charged ions on the p-side. Since hydrogen diffuses as a proton (H+) in p-type semiconductors, the built-in electric field at this p-n junction repels the positively charged hydrogen ions, preventing the hydrogen from out-diffusing efficiently. In addition, the diffusivity of H in n-type semiconductors is extremely low.

What is needed is an improved technique for increasing the conductivity of a p-type buried layer in tunnel junction LEDs, heterojunction bipolar transistors, and other structures which incorporate a p-type buried layer.

SUMMARY

In one embodiment of the present invention, the wafer incorporating a Group III–V buried p-layer (the acceptor-doped layer) is etched to form trenches in the p-layer to expose sides of the p-layer.

After the etch, the wafer is then annealed at an anneal temperature that may be below the typical 800° C. temperature used in the prior art. The length of the anneal depends upon the spacing of the exposed sides of the p-layer. The hydrogen diffuses easily through the p-type layer and out the sides exposed by the trenches, rather than through the overlying n-type layer. The result is a buried p-type layer that is more highly conductive than prior art p-type buried layers.

In another embodiment, such as in a heterojunction bipolar transistor, where the Mg-doped base layer is buried under an n-type emitter layer, the n-type emitter layer is etched to expose a top area of the Mg-doped base layer. This exposed area may be a contact area for a subsequently formed metal contact. An anneal step is performed prior to the metal contact being formed to allow the hydrogen to out-diffuse from the entire Mg-doped base layer through the exposed area.

Either technique for exposing a buried Group III–V p-type layer may be employed prior to an anneal step to out-diffuse hydrogen from the p-type layer.

DETAILED DESCRIPTION OF THE EMBODIMENTS

Figure 3:
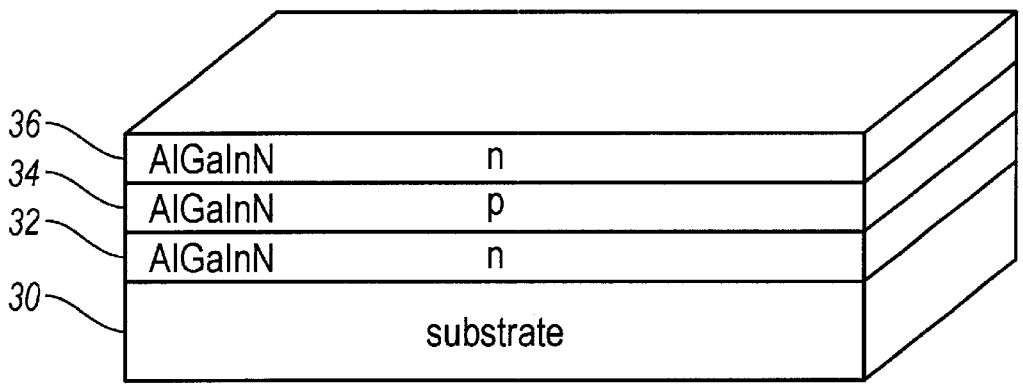
FIG. 3 is a cross-sectional view of a portion of an epitaxial wafer having grown on it n-p-n layers for forming a tunnel junction LED.

FIG. 3 is a cross-section of a portion of a wafer comprising a substrate 30 formed of sapphire, SiC, or other material. The substrate 30 may be transparent or opaque. Grown on substrate 30, typically using a metalorganic chemical vapor deposition (MOCVD) process, is an n-type layer 32 of a compound such as AlGaInN or other III–V compound semiconductor material. Growing such epitaxial layers is extremely well known in the art and is performed by introducing various gases to contribute the Group III–V components as well as the n-type dopant, such as silicon. These layers are grown at temperatures in the range of 500° C.–1100° C. or higher. Such growth processes are described in U.S. Pat. Nos. 5,729,029 and 6,133,589, incorporated herein by reference.

The n-type layer 32 is typically between 1–2 $\mu$m but may be more or less depending upon the desired characteristics of the resulting LED and the substrate material. The n-type layer 32 may comprise various layers of n-type material and may also include undoped layers.

Over n-type layer 32 is formed a p-type layer 34 of, for example, AlGaInN. A common acceptor dopant for III–V compounds is magnesium. The p-type layer 34 may comprise various layers of acceptor-doped material. The p-type layer 34 is typically highly doped to achieve a Mg concentration greater than $5\times10^{18}$ cm$^{-3}$.

A second n-type layer 36 is then epitaxially grown over the p-type layer 34. The n-type layer 36 may also comprise multiple n-type layers.

As previously discussed, NH$_3$ is a common gas for contributing nitrogen in the various layers. NH$_3$ also contributes free hydrogen into the p-type layer 34, which passivates most of the Mg acceptors in the p-type layer 34. This results in the p-type layer 34 being resistive (about 5000 $\Omega$-cm) and unacceptable for use in most device structures. A conventional anneal of the as-grown epitaxial wafer in a H-free ambient, typically used to out-diffuse hydrogen from acceptor-doped layers, is not effective due to the n-type layer 36 overlying the p-type layer 34 blocking the out-diffusion of hydrogen.

Figure 4:
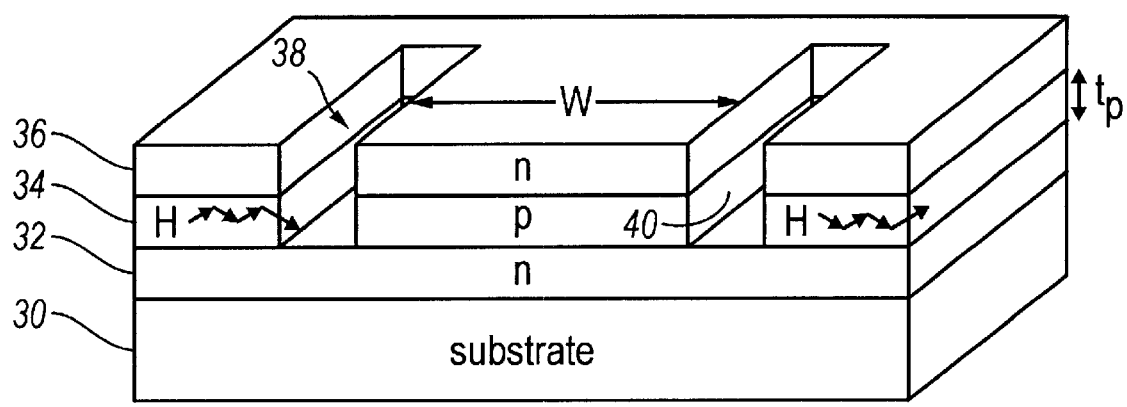
FIG. 4 is a cross-sectional view of the wafer portion of FIG. 3, where the wafer is etched to expose sides of the buried p-layer prior to annealing the wafer to out-diffuse hydrogen from the p-layer.

To provide an avenue for the hydrogen to escape the p-type layer 34 so as to activate the Mg acceptors, the wafer surface is patterned using conventional photolithographic techniques and etched, as shown in FIG. 4, to form trenches 38 to expose sides 40 of the p-type layer 34. In one embodiment, the width of the p-type layer 34 between trenches 38 is approximately 1 $\mu$m to 1000 $\mu$m, and the thickness ($t_p$) of the p-type layer 34 is approximately 500 Angstroms to 5 $\mu$m. The width of each p-type layer portion between the trenches may be much less than the width of the final LED after dicing and packaging, so there may be multiple trenches in each LED. The trenches may be formed as elongated strips as shown in FIG. 4, or may be formed using any geometry (square or circular holes, serpentine patterns, etc.).

In the preferred embodiment, a mask of SiO$_2$, metal, or photoresist is used, followed by an RIE etch to etch the trenches 38. The mask may then be removed, and the wafer annealed at an anneal temperature between 200–900° C. until sufficient hydrogen has out-diffused through the exposed sides 40 of the p-type layer 34. In one embodiment, the anneal is carried out at 800° C. for ten minutes. The acceptor-doped layer 34 (initially p-type but with high resistivity) is now p-type with low resistivity. The anneal parameters to out-diffuse H from the exposed sides 40 of the p-type layer 34 is dependent upon the aspect ratio (W/$t_p$). The anneal step will typically out-diffuse nearly all of the hydrogen. The starting hole density before the anneal is typically about $5\times10^{15}$cm$^{-3}$, and the final hole density after the anneal is typically greater than $1\times10^{17}$cm$^{-3}$.

Figure 1:
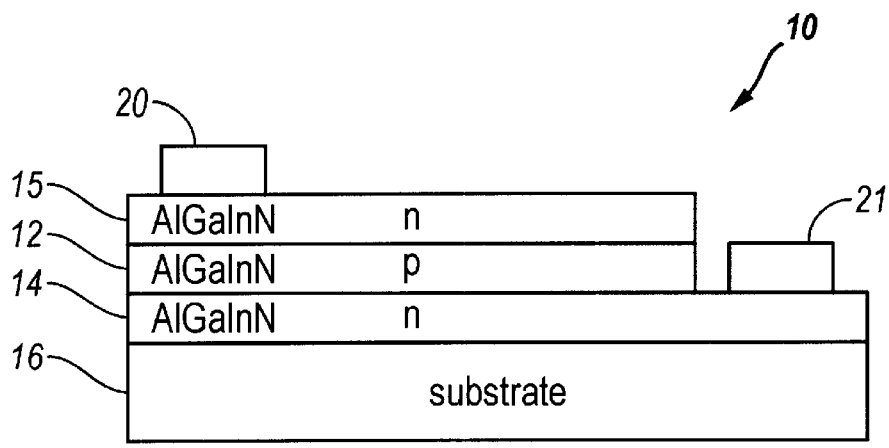
FIG. 1 is a cross-sectional view of a tunnel junction LED structure.
Figure 5:
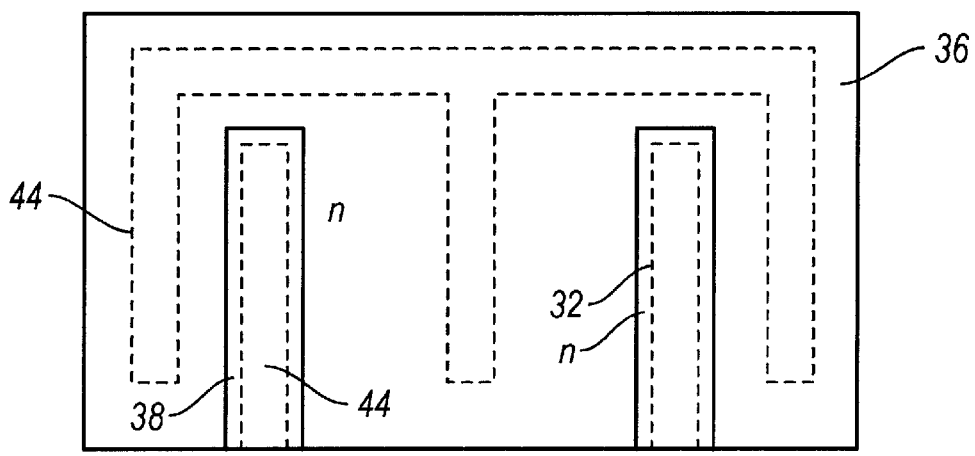
FIG. 5 is a top down view of a separated LED showing the trenches and showing metal strips in dashed outline.

FIG. 5 is a top-down view of a single LED structure on the wafer. As shown in FIG. 5, contact metal 44 (shown in dashed outline), such as TiAl, is deposited and patterned to form metal lines in ohmic contact with the n-type layers 36 and 32. As described with respect to FIG. 1, the upper n-type layer 36 is reversed biased with respect to the p-type layer 34. Tunnel current flows through the junction, causing the p-layer 34 to be effectively coupled to the biasing voltage applied to the upper n-type layer 36. A forward biasing voltage is applied to the lower p-n junction. Light is emitted when the electrons and holes recombine in the active region, typically located near the top of the n-type layer 32. Wire bonds may be used to contact the metal 44, or the device may be a flip-chip, where bonding pads around the metal 44 are directly soldered to pads on a submount. Additional trenches 38 without metal 44 may also be formed to aid in H out-diffusion.

In one experiment, the resulting LED had a forward voltage of less than 4 volts and the most uniform light-up pattern ever observed in a tunnel-junction device. Surprisingly, the present technique appears to work for very large aspect ratios (W/t$_{p}$=100). The technique has clear benefits for achieving more complete activation while minimizing thermal damage, since the anneal may be carried out at a lower temperature and for less time. This technique particularly applies to manufacturing devices such as HBTs or tunnel-junction LEDs or lasers.

Although this technique has been shown applied to a p-layer buried below an n-type layer, this invention may also apply to any structure with a p-layer having a surface layer that creates a barrier to H out-diffusion. Such a barrier may be surface-state-induced band-bending occurring even without an overlying n-type layer.

Figure 2:
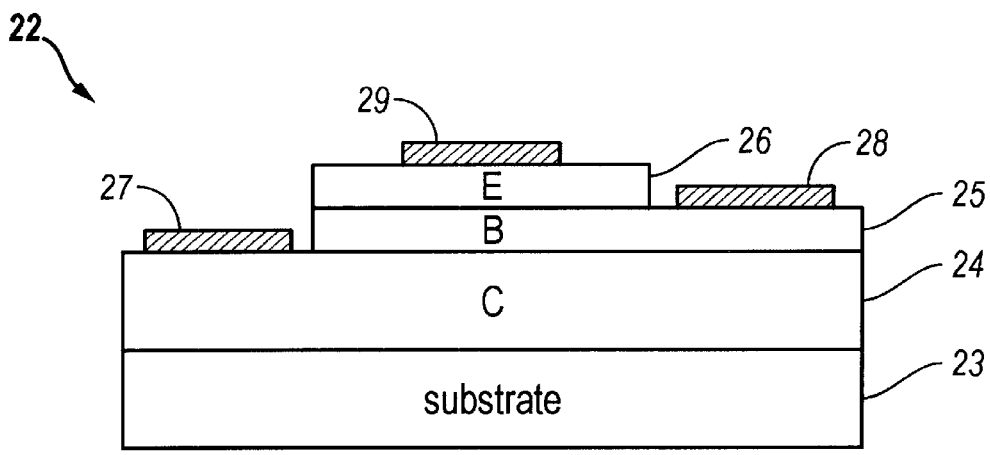
FIG. 2 is a cross-sectional view of a typical heterojunction bipolar transistor.

FIG. 2, previously discussed, illustrates an acceptor-doped GaN base layer 25 that is considered buried because, during a conventional anneal step, out-diffusion of hydrogen is blocked by the overlying n-type emitter 26. In the prior art, the anneal is carried out prior to the etching of the n-type emitter 26 to form the contact areas. Hence, in the past, annealing the structure did not remove all the hydrogen from the base layer 25, resulting in a high resistivity p-type base layer 25.

Figure 6:
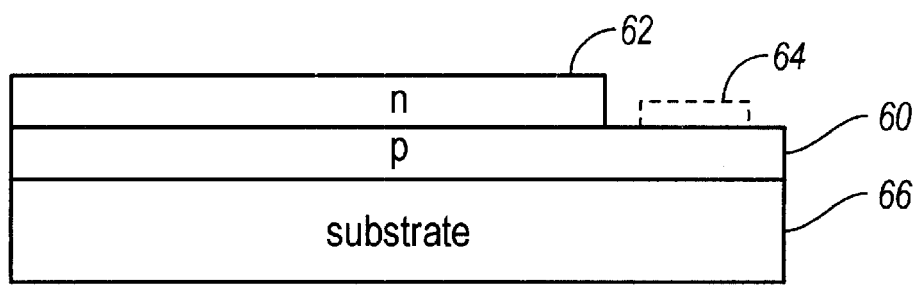
FIG. 6 is a cross-sectional view of a portion of a GaN semiconductor structure that is annealed after etching an n-type layer to expose a surface of a p-layer (e.g., an Mg-doped layer) to out-diffuse hydrogen from the p-layer.

FIG. 6 illustrates an intermediate step when forming devices having a buried GaN acceptor-doped layer. In FIG. 6, a buried acceptor-doped GaN layer 60 is exposed by etching an overlying n-type GaN layer 62. An anneal at 400° –900° C. is then performed prior to the formation of a metal contact 64 on the exposed surface portion of layer 60 to out-diffuse hydrogen from the layer 60 through the exposed surface portion. Note that the lateral sides of the acceptor-doped layer 60 in FIG. 6 are not exposed, since the wafer has not yet been diced.

Thus, either the trench forming technique of FIG. 4 or the technique of FIG. 6 is performed to out-diffuse hydrogen from the buried acceptor-doped layer.

The basic structure of FIG. 6 may be the basis for many types of semiconductor devices, including LEDs, laser diodes, p-i-n photodetectors, or other devices. This structure may also be used to prevent parallel-conduction problems in electron devices such as high electron mobility transistors. The teachings of the present invention may be applied to any of these devices.

The thermal activation process described herein may also be modified. For example, it may be combined with UV exposure, electron-beam bombardment, ultrasonic vibration, or exposure to electromagnetic radiation in order to increase the effectiveness of the acceptor activation or to allow activation at temperatures below 400° C.

The buried acceptor-doped layer may be grown with very high initial resistivity (even insulating) under certain conditions. In this case, the teaching of this invention is still applicable.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a semiconductor structure comprising:
    forming a Group III–V compound semiconductor layer doped with acceptors to form an acceptor-doped layer, a majority of acceptors being passivated by hydrogen in said acceptor-doped layer;
    forming a Group III–V n-type layer overlying said acceptor-doped layer;
    etching said n-type layer to expose a portion of said acceptor-doped layer; and
    annealing said acceptor-doped layer to out-diffuse hydrogen at least through the exposed portion of said acceptor-doped layer to activate said acceptors to increase a hole density in said acceptor-doped layer and decrease a resistivity of said acceptor-doped layer.

2. The method of claim 1 wherein said etching comprises etching trenches in said acceptor-doped layer to expose sides of said acceptor-doped layer and said annealing comprises annealing said acceptor-doped layer to out-diffuse hydrogen through said sides of said acceptor-doped layer exposed by said trenches.

3. The method of claim 1 further comprising forming a second n-type layer underlying said acceptor-doped layer.

4. The method of claim 2 wherein said forming trenches comprises forming trenches between approximately 1 micron to 1000 microns apart.

5. The method of claim 1 wherein said forming said acceptor-doped layer comprises forming an acceptor-doped layer between approximately 500 Angstroms and 5 microns thick.

6. The method of claim 1 wherein said annealing out-diffuses substantially all of said hydrogen.

7. The method of claim 1 wherein said acceptors comprise magnesium.

8. The method of claim 1 wherein said semiconductor structure forms a light emitting device.

9. The method of claim 8 further comprising forming a second n-type layer underlying said acceptor-doped layer to form a tunnel junction light emitting device.

10. The method of claim 1 further comprising forming a second n-type layer underlying said acceptor-doped layer to form a heterojunction bipolar transistor.

11. The method of claim 1 wherein said annealing is carried out at a temperature less than approximately 850° C.

12. The method of claim 1 wherein said annealing is carried out at a temperature between approximately 400° C.–600° C.

13. The method of claim 1 wherein said acceptor-doped layer comprises a plurality of layers.

14. The method of claim 1 wherein said etching comprises etching said second layer to expose a surface of said acceptor-doped layer.

15. The method of claim 1, wherein said Group III–V n-type layer comprises a plurality of layers.

* * * * *

UNITED STATES PATENT AND TRADEMARK OFFICE
CERTIFICATE OF CORRECTION

PATENT NO.      : 6,537,838 B2
DATED           : March 25, 2003
INVENTOR(S)     : Stephen A. Stockman It is certified that error appears in the above-identified patent and that said Letters Patent is hereby corrected as shown below:

<u>Title page,</u>
Item [73], cancel "Limileds" and substitute -- Lumileds --.

Signed and Sealed this

Thirteenth Day of May, 2003

JAMES E. ROGAN
*Director of the United States Patent and Trademark Office*